(12) United States Patent
Balachandran et al.

(10) Patent No.: US 12,087,828 B2
(45) Date of Patent: Sep. 10, 2024

(54) ELECTRODES FOR MAKING NANOCARBON-INFUSED METALS AND ALLOYS

(71) Applicants: Uthamalingam Balachandran, Willowbrook, IL (US); Stephen E. Dorris, LaGrange Park, IL (US); Beihai Ma, Naperville, IL (US); Tae H. Lee, Naperville, IL (US); David R. Forrest, Washington, DC (US); Christopher Klingshirn, College Park, MD (US)

(72) Inventors: Uthamalingam Balachandran, Willowbrook, IL (US); Stephen E. Dorris, LaGrange Park, IL (US); Beihai Ma, Naperville, IL (US); Tae H. Lee, Naperville, IL (US); David R. Forrest, Washington, DC (US); Christopher Klingshirn, College Park, MD (US)

(73) Assignees: UChicago Argonne, LLC, Chicago, IL (US); U.S. Department of Energy, Washington, DC (US)

(\*) Notice: Subject to any disclaimer, the term of this patent is extended or adjusted under 35 U.S.C. 154(b) by 1641 days.

(21) Appl. No.: 16/209,657

(22) Filed: Dec. 4, 2018

(65) Prior Publication Data
US 2020/0176573 A1    Jun. 4, 2020

(51) Int. Cl.
*H01L 29/40* (2006.01)
*C01B 32/20* (2017.01)
(Continued)

(52) U.S. Cl.
CPC .............. *H01L 29/401* (2013.01); *C22B 9/16* (2013.01); *C22C 9/01* (2013.01); *C01B 32/20* (2017.08)

(58) Field of Classification Search
CPC .... C22B 4/00; C22B 4/02; C22B 4/04; C22B 4/06; C22B 9/00; C22B 1/24; C22B 7/00;
(Continued)

(56) References Cited

U.S. PATENT DOCUMENTS 2,441,416 A * 5/1948 Hopkins .................. H05B 7/12
165/47
3,480,716 A * 11/1969 Hill ........................... F27B 5/04
373/70
(Continued)

FOREIGN PATENT DOCUMENTS

CN          1038873 A  *  1/1990
CN       108504886 A  *  9/2018
(Continued)

OTHER PUBLICATIONS

R. Brandt and G. Neuer, Electrical Resistivity and Thermal Conductivity of Pure Aluminum and Aluminum Alloys up to and above the Melting Temperature, Oct. 2007, International Journal of Thermophysics, vol. 28, No. 5, p. 1441 (Year: 2007).*
(Continued)

*Primary Examiner* — Keith D. Hendricks
*Assistant Examiner* — Nikolas Takuya Pullen
(74) *Attorney, Agent, or Firm* — Olson & Cepuritis, Ltd.

(57) ABSTRACT

A method for preparing a covetic, nanocarbon-infused, metal composite material is described is herein. The method comprises heating a stirring molten mixture of a metal (e.g., Cu, Al, Ag, Au, Fe, Ni, Pt, Sn, Pb, Zn, Si, and the like) and carbon (e.g., graphite) at a temperature sufficient to maintain the mixture in the molten state in a reactor vessel, while passing an electric current through the molten mixture via at least two spaced electrodes submerged or partially submerged in the molten metal. Each of the electrodes has an electrical conductivity that is at least about 50 percent of the
(Continued)

electrical conductivity of the molten mixture at the temperature of the molten mixture. Preferably, the conductivity of the electrodes is equal to or greater than the conductivity of the molten mixture.

13 Claims, 4 Drawing Sheets

(51) Int. Cl.
*C22B 9/16* (2006.01)
*C22C 9/01* (2006.01)

(58) Field of Classification Search
CPC .............. C22C 26/00; C22C 2026/002; C22C 21/00; C22C 47/14; H01L 29/401; H01L 29/40; H01L 29/40; F27B 3/085; F27D 11/00; F27D 11/08; F27D 11/10; H05B 7/12; H05B 7/06; H05B 7/08; H05B 7/10
USPC .................................. 204/270, 272, 670, 671
See application file for complete search history.

(56) References Cited

U.S. PATENT DOCUMENTS

| | | | | |
|---|---|---|---|---|
| 5,467,366 | A | * | 11/1995 | Wilhelmi ................... F27B 3/22 373/105 |
| 5,573,573 | A | * | 11/1996 | Berger ..................... F27B 3/085 75/10.63 |
| 5,673,285 | A | * | 9/1997 | Wittle ...................... F27B 3/085 373/79 |
| 8,541,336 | B2 | | 9/2013 | Shugart et al. |
| 8,647,534 | B2 | | 2/2014 | Shugart et al. |
| 9,273,380 | B2 | | 3/2016 | Shugart et al. |
| 2016/0101398 | A1 | | 4/2016 | Worsley et al. |
| 2016/0200618 | A1 | * | 7/2016 | Boughton ................ H05H 1/30 501/72 |
| 2017/0298476 | A1 | | 10/2017 | Braydich et al. |
| 2018/0073110 | A1 | | 3/2018 | Balachandran et al. |

FOREIGN PATENT DOCUMENTS

| | | | | |
|---|---|---|---|---|
| GB | 1457618 | A * | 12/1976 | ............. H05B 7/085 |
| GB | 2213198 | A * | 8/1989 | ............. H01T 13/52 |
| WO | WO-2012122035 | A2 * | 9/2012 | ......... C22C 32/0052 |

OTHER PUBLICATIONS

Eder, Dominik Schlögl, Robert, Nanocarbon-Inorganic Hybrids—Next Generation Composites for Sustainable Energy Applications, 2014, De Gruyter, p. 228 (Year: 2014).*
ASM International Handbook Committee. (1990). ASM Handbook, vol. 02—Properties and Selection: Nonferrous Alloys and Special-Purpose Materials—5.1.2 Selection of Casting Alloys. ASM International. p. 127 (Year: 1990).*
Engineering ToolBox, (2003). Air—Composition and Molecular Weight. (Year: 2003).*
Melting Point of Common Metals, Alloys, & Other Materials, Jul. 2, 2015, AE Toolbox, p. 2 (Year: 2015).*
Matula, R.A., Electrical Resistivity of Copper, Gold, Palladium, and Silver, 1979, J. Phys. Chem. Ref. Data, vol. 8, No. 4, (Year: 1979).*
Bakir, M. et al., Novel Metal-Carbon Nanomaterials: A Review on Covetics, Advanced Materials Letters 8 (9), 884-890 (2017).
Forrest, David R., Approaches to High Performance Conductors, Next Generation Electric Machines Workshop, NIST, Gaithersburg, MD (2015).
Forrest, D.R. et al., Novel Metal-Matrix Composites with Integrally-Bound Nanoscale Carbon, Proceedings of Nanotech Conference and Expo, Santa Clara, CA, CRC Press (2012).
Hintalla, W.W. et al . . . , The Electrical Conductivity of the Copper-Aluminum Alloys, Bachelors Theses and Reports, (72), 1928-1970 (1937).
Knych, T. et al., Fabrication and Cold Drawing of Copper Covetic Nanostructured Carbon Composites, Archives of Metallurgy and Materials 59 (4), 1283-1286 (2014).
Salamanca-Riba, L. et al., A New Type of Carbon Nanostructure Formed Within A Metal-Matrix, Presented at Tech Connect World, Santa Clara, CA (2012).
Wouters, M.C.H.M., et al., The Electrical Conductivity of Silicon Between 500C and 1200° C., Philips Res. Repts. 31, 278-283 (1976).

* cited by examiner

ELECTRODES FOR MAKING NANOCARBON-INFUSED METALS AND ALLOYS

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE INVENTION

This invention relates to a method for making metal-nanostructured carbon composites, also known as covetic materials, and to materials prepared by the method.

BACKGROUND

Significant research interest has been attracted to the development of metal-carbon composite materials, in an effort to improve their thermophysical, mechanical, and electrochemical properties. Metal-carbon composites and compounds (also known as "covetic materials" or "covetics") are novel materials that have recently attracted increased research interest due to their potential for energy-saving applications. The term "covetic" is derived from "covalent" and "metallic", in that there appears to be some type of hybrid bonding with attributes of covalent bonds and of metallic bonds between the metal and the carbon nanoparticles. Covetics comprise metals that have been infused with nanocarbon materials through a unique electrocharging process in which carbon is incorporated into the metal matrix by stirring a mixture of molten metal and carbon while applying electrical current. The covetic conversion process can produce structures that would not normally be thermodynamically available via conventional processing methods, but which remain stable once established. The infusion of nanocarbon is tenaciously bound to the metal (i.e., with a strong interface between metal and carbon phases), which increases the electrical and thermal conductivities, and, in some cases, increases the strength, raises the melting point, and/or significantly alters the surface tension of the covetic material relative to the pure metal.

Covetics are commercially important because covetic manufacturing processes can be scalable to tonnage quantities with widespread implications for energy savings in hundreds of potential applications, such as high-voltage electrical transmission, electrical motors and generators, advanced heat exchangers, electrodes for fuel cells, batteries, supercapacitors, and for thermal management in micro- and power electronics. Covetics are an important tool for materials scientists and engineers who have long sought to combine metals with light-weight and high-conductivity carbon in their pursuit to improve materials performance.

As discussed above, covetic materials have a form of nanocarbon dispersed within a metal matrix. Covetic materials can retain their enhanced properties after re-melting, and in some cases, have demonstrated the ability to withstand more than 1,500 degrees Celsius without separation of carbon and metals. Some covetic materials can be turned into a vapor phase at even higher temperatures, be deposited on another surface, and still retain the nanocarbon phase and enhanced properties. The effects of added carbon depend on the metal used.

Processing methods have been developed for making covetic compositions. For example, metal-carbon compositions have been prepared via mixing carbon powder into melted metal (e.g., Cu, Al, Ag, Au, Fe, Ni, Pt, Sn, Pb, etc.) with stirring, and then converted to covetics by applying an electrical current between electrodes submerged in the molten mixture, and then solidifying the resulting product once conversion is complete. Similar to conventional metals, these metal-carbon composites can be rolled into thin sheets, drawn into wires, or machined into parts.

Conventional processes for making covetic metal-carbon compositions, such as covetic copper-carbon composites (also referred to herein as "covetic copper") or covetic aluminum-carbon composites ("covetic aluminum") have typically been performed using graphite electrodes, often cylindrical in shape, submerged or partially submerged in the molten metal-carbon mixture, either under vacuum, under an inert atmosphere, or in ambient air atmosphere.

The known methods of preparing covetic materials often result in inconsistent results from batch-to-batch, as well as inhomogeneities within a given batch, especially when performed in large commercial quantities. Thus, there is an ongoing need for alternative methods for producing covetic materials with improved properties over native metal, with improved batch-to-batch reproducibility and/or improved homogeneity within a given batch. The methods described herein address this need.

SUMMARY

A method (i.e., a process) for preparing a covetic, nanocarbon-infused, metal composite material is described is herein. The method comprises heating a stirring molten mixture of a metal (e.g., Cu, Al, Ag, Au, Fe, Ni, Pt, Sn, Pb, Zn, Si and the like) and carbon (e.g., graphite) at a temperature sufficient to maintain the mixture in the molten state in a reactor vessel, while passing an electric current through the molten mixture (also referred to herein as a "melt-pool") via at least two spaced electrodes that are immersed or at least partially immersed in the molten mixture. The electrodes are in circuit with an electrical power source (either AC or DC) that supplies the electric current, and each electrode has an electrical conductivity that is at least about 50 percent of the electrical conductivity of the molten mixture at the temperature of the molten mixture. Preferably, the electrical conductivity of the electrodes is equal to or greater than the electrical conductivity of the molten mixture. The reactor is heated at a temperature sufficient to keep the metal molten during the entire conversion process. After current is passed through the mixture for e.g., about 10 minutes to one hour, the covetic material is recovered from the reactor vessel.

Preferably, the reactor vessel is kept under an inert atmosphere or vacuum, sufficient to maintain a low level of oxygen, e.g., a partial pressure of oxygen of not more than about 0.1 Torr in the reactor vessel during melting and conversion.

The carbon is mixed with the metal by stirring to distribute carbon within the molten metal. The carbon may be added to the molten metal or can be added to the metal before melting, if desired.

In some embodiments, the current is supplied at a current density of about 50 to about 1000 Amperes per square centimeter ($A/cm^2$) based on the area of the electrodes contacting the molten metal.

In any of the method embodiments described herein, the electrodes and any stirring equipment or other accessories may be removed from the molten covetic product prior to isolating the product. The covetic material optionally can be cooled before or after being removed from the reactor. In some embodiments the covetic material can be cooled at a controlled rate (e.g., about 20 to 500° C. per hour), if desired.

The methods described herein are advantageous in that they provide for a much more uniform current distribution through the molten mixture compared to the prior art use of electrodes that have substantially lower electrical conductivities than the molten mixture, e.g., using graphite electrodes with metals that typically have conductivities at least an order of magnitude higher than graphite at the reaction temperatures. The more uniform current distribution, in turn, leads to one or more improved properties and/or advantageous features, such as improved uniformity of the resulting covetic structure, better batch-to-batch uniformity, improved electrical and thermal conductivities, and the like, compared to prior art methods. The methods described herein also are amenable to reproducible large scale production.

In some embodiments, the metal is selected from the group consisting of Cu, Al, Ag, Au, Fe, Ni, Pt, Sn, Pb, Zn, and Si, as well as alloys of two or more thereof. As used herein, metaloid elements such as Si are to be considered as metals with regard to the covetic materials described herein. In some preferred embodiments, the metal comprises copper, aluminum, a copper alloy or an aluminum alloy. In any of the process embodiments described herein the metal can be introduced into the reactor in any convenient form, e.g., as chunks, slugs, grains, shot, powders, and the like. As used herein, the phrase "alloys of two or more thereof" refers to alloys that include two or more of the listed metals, such as, e.g., Cu—Al alloy, Au—Ag alloy, Cu—Al—Ni alloy, and the like. Such alloys can include small amounts of other elements such as, e.g., Mg and Si, which are commonly found in Al alloys, or Cr, Ni, Mn, Si, which are commonly found in Fe alloys. In some embodiments, the metal is selected from the group consisting of copper, a copper alloy, aluminum, an aluminum alloy, silver and a silver alloy.

The carbon can be any type of elemental carbon. In some embodiments, the carbon comprises graphite, carbon black, activated carbon, graphene, carbon nanotubes, carbon nanofibers, or a combination of two or more thereof. In some preferred embodiments, the carbon is graphite. In some preferred embodiments the carbon is a particulate carbon material. Preferably, the particulate carbon material comprises carbon granules, carbon microparticle powder, or a combination of such materials. Optionally, the carbon particles can comprise carbon nanotubes, carbon nanofibers, or a combination thereof, which can be pre-encapsulated by a metal, unencapsulated, or which can encapsulate metal atoms. Optionally, the carbon portion of the covetic material can initially be incorporated with the metal in the form of a non-covetic carbon-metal alloy (also referred to as a "mechanical" alloy). For example, a non-covetic metal-carbon alloy (e.g., Cu—C alloy) can be melted and utilized in the methods described herein (e.g., as the sole starting material, or in combination with a metal) to form a covetic product. Preferably, the amount of carbon added to the metal comprises about 0.1 to about 10 (e.g., about 0.3 to about 4%) percent by weight based on the total combined weight of the metal and carbon. In some preferred embodiments, the metal comprises copper, aluminum, a copper alloy, or an aluminum alloy, and the carbon material comprises graphite.

The reactor vessel used in process described herein may be open (i.e., not sealed) or closed (i.e., sealed) with inlets and outlets for gas control, stirring, adding carbon, adding the metal, and the like. The reactor vessel and all other components that will be exposed to the temperatures required for the process are composed of materials capable of handling the temperatures achieved during the process. In some embodiments the reactor vessel and other internal components are composed of graphite, a ceramic (e.g., aluminum oxide ceramic), and similar materials. In some embodiments, the reactor comprises a stirrer (e.g., made from graphite or a ceramic material) for mixing of the carbon with the molten metal (in some cases, gentle, non-vortexing mixing is preferred). The reactor also includes electrodes for passing the electric current through the molten metal, as described herein. The electrodes can be typical cylindrical electrodes, or can be shaped to provide a better surface area for current application or a better current distribution than cylindrical electrodes, e.g., planar electrodes, or electrodes with a profile that is complementary to the geometry of the melt-pool within the reactor.

In order to maintain the required low partial pressure of oxygen, the reactor vessel, if unsealed, may, itself, be contained in a sealed chamber under a vacuum, or may be kept under an inert gas, to maintain the partial pressure of oxygen at or below a level suitable for a given metal. Any inert gas with the required low partial pressure of oxygen may be utilized in the process described herein. In some embodiments the inert gas comprises nitrogen (e.g., high purity or ultra-high purity nitrogen). In other embodiments the inert gas comprises helium (e.g., high purity or ultra-high purity (UHP) helium). Optionally, a vacuum may be used to maintain the partial pressure of oxygen to a suitably low level. In the present method, the partial pressure of oxygen within the reaction vessel preferably is in the range of about 0.001 Torr to about 0.1 Torr, although even lower partial pressures are entirely acceptable.

Also described herein is a covetic material produced by the process described herein. Preferably, the base metal component of the covetic material is selected from the group consisting of Cu, Al, Ag, Au, Fe, Ni, Pt, Sn, Pb, Zn, and Si, optionally along with other alloying elements to balance the full range of thermophysical and mechanical properties that may be desired. Preferably, the carbon is present at a concentration of about 0.1 to about 10 percent by weight based on the total weight of the composite. In some embodiments, the carbon is present at a concentration of about 0.3 to about 4 percent by weight based on the total weight of the composite.

The following non-limiting, exemplary embodiments illustrate certain aspects and features of the processes and materials described herein.

Embodiment 1 is a process for preparing a covetic nanocarbon-infused metal comprising the steps of:
  (a) heating a stirring molten mixture of a metal (e.g., Cu, Al, Ag, Au, Fe, Ni, Pt, Sn, Pb, Zn, Si, and the like) and carbon (e.g., graphite) at a temperature sufficient to maintain the mixture in the molten state in a reactor vessel;
  (b) passing an electric current through the molten mixture via at least two electrodes that are immersed or at least partially immersed in the molten mixture; and
  (c) recovering the resulting covetic nanocarbon-infused metal product from the reactor vessel;
  wherein the electrodes are in circuit with an electrical power source that supplies the electric current, each electrode has an electrical conductivity that is at least about 50 percent of the electrical conductivity of the molten mixture at the temperature of thereof; and wherein the electrodes are either (A) constructed from a material that does not melt at the temperature at which the molten mixture is heated, (B) the electrodes are actively cooled to prevent melting, or both (A) and (B).

Embodiment 2 is the process of embodiment 1, wherein the electrodes are constructed from a material that does react with the molten mixture at the temperature at which the molten mixture is heated, for example, the electrode metal can be inherently non-reactive, or the electrodes can be coated with a substance that provides an inert barrier to reaction of the electrodes with the molten mixture. As used herein with regard to the electrodes and molten mixture, the phrases "react with" and "reaction of" refer to any physical or chemical transformation of the electrodes and/or the molten mixture, such as, e.g., dissolution of the electrode into the molten mixture, alloying of the electrode with the molten mixture, absorption of the molten metal into the electrode, absorption of carbon into the electrode, or any other transformation that changes the empirical chemical composition of the electrode, the molten mixture, or both.

Embodiment 3 is the process of embodiment 1 or 2, wherein the metal of the molten mixture comprises at least one metal selected from the group consisting of e.g., Cu, Al, Ag, Au, Fe, Ni, Pt, Sn, Pb, Zn, and Si.

Embodiment 4 is the process of any one of embodiments 1 to 3, wherein the metal of the molten mixture comprises copper; and the electrodes are constructed from a material selected form the group consisting of (a) molybdenum, (b) titanium diboride ($TiB_2$; which is inert to molten copper and has an electrical conductivity of about 10 MS/m; at a typical covetic copper processing temperature, the electrical conductivity of $TiB_2$ will be about 75% of the conductivity of the molten Cu mixture) (c) copper or a copper alloy; wherein the electrodes are actively cooled to prevent melting of the electrodes; and (d) one or more metals selected from the group consisting of tungsten and palladium; wherein the electrodes are coated with a substance that provides an inert barrier to reaction of the electrodes with the molten mixture.

Embodiment 5 is the process of embodiment 4, wherein the substance that provides an inert barrier comprises at least one material selected from the group consisting of a conductive ceramic material, a conductive metal, a conductive intermetallic, and a conductive alloy.

Embodiment 6 is the process of any one of embodiments 1 to 3, wherein the metal of the molten mixture comprises aluminum; and the electrodes are constructed from (a) aluminum bronze, (b) titanium diboride, or (c) one or more metal selected from the group consisting of copper, molybdenum, silver, gold, and platinum; wherein the electrodes are coated with a substance that provides an inert barrier to reaction of the electrodes with the molten mixture.

Embodiment 7 is the process of embodiment 6, wherein the substance that provides an inert barrier comprises at least one material selected from the group consisting of a conductive ceramic material, a conductive metal, a conductive intermetallic, and a conductive alloy.

Embodiment 8 is the process of any one of embodiments 1 to 3, wherein the metal of the molten mixture comprises iron; and the electrodes are constructed from one or more metals selected from the group consisting of tungsten, molybdenum, iridium, ruthenium; and titanium diboride; wherein the electrodes are coated with a substance that provides an inert barrier to reaction of the electrodes with the molten mixture.

Embodiment 9 is the process of embodiment 8, wherein the substance that provides an inert barrier comprises at least one material selected from the group consisting of a conductive ceramic material, a conductive metal, a conductive intermetallic, and a conductive alloy.

Embodiment 10 is the process of any one of embodiments 1 to 9, wherein the carbon is a particulate carbon material.

Embodiment 11 is the process of any one of embodiments 1 to 10, wherein the carbon comprises graphite.

Embodiment 12 is the process of any one of embodiments 1 to 11, wherein the process in conducted under an inert atmosphere having a partial pressure of oxygen of not more than about 0.1 Torr.

Embodiment 13 is the process of any one of embodiments 1 to 12, wherein the process in conducted under an inert atmosphere having a partial pressure of oxygen in a range of about 0.001 Torr to about 0.1 Torr.

Embodiment 14 is the process of any one of embodiments 1 to 11, wherein the molten mixture is heated at a temperature of at least about 50° C. above the melting point of the metal of the molten mixture (for example, the melting point of Cu is about 1083° C., while covetic copper typically is processed at about 1150° C.; and the melting point of aluminum is about 660° C., while covetic aluminum typically is processed at about 700-750° C. range).

Embodiment 15 is the process of any one of embodiments 1 to 14, wherein the total amount of carbon in the molten mixture comprises about 0.1 to about 10 percent by weight of the molten mixture.

Embodiment 16 is the process of any one of embodiments 1 to 15, wherein the total amount of carbon introduced into the metal comprises about 0.3 to about 4 percent by weight of the molten mixture.

Embodiment 17 is the process of any one of embodiments 1 to 16, wherein the electrodes comprise a plurality of electrically-connected, spaced, peripheral electrodes surrounding a central electrode.

Embodiment 18 is the process of any one of embodiments 1 to 17, wherein at least one of the electrodes has a shape selected from the group consisting of a tubular shape, a ring shape, a planar shape, and a curved-trough shape.

Embodiment 19 is the process of any one of embodiments 1 to 18, wherein the electrodes are sized, shaped, and positioned in the reactor in an arrangement that provides a substantially uniform current density within the entire molten mixture.

Embodiment 20 is the process of any one of embodiments 1 to 19, wherein the conductivity of the each electrode is greater than or equal to the conductivity of the molten mixture.

DETAILED DESCRIPTION

Figure 1:
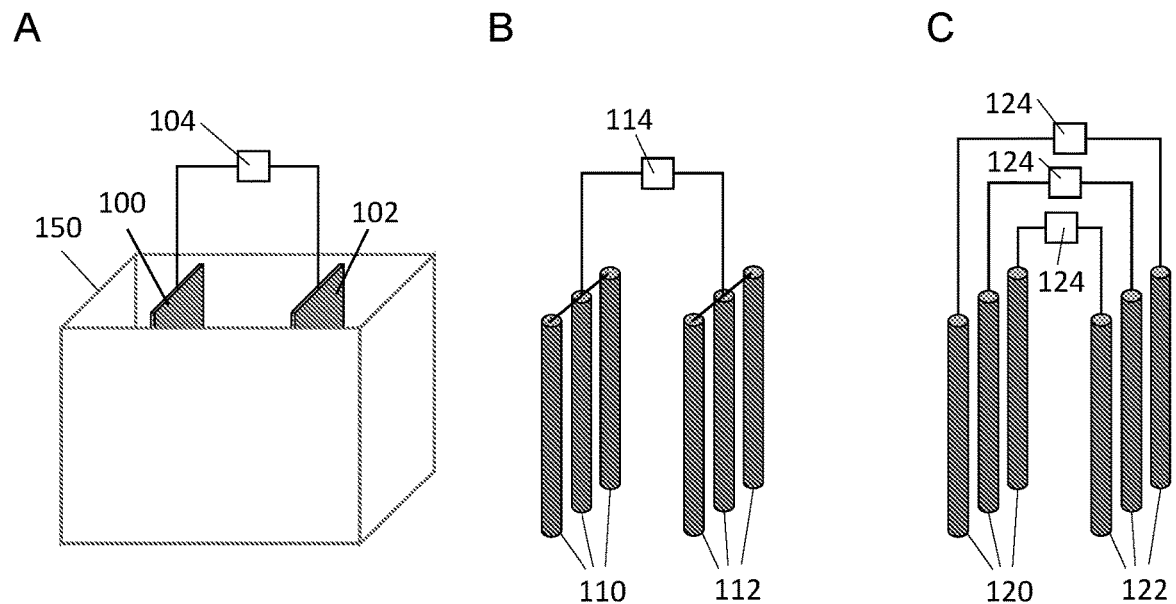
FIG. 1 illustrates arrangements of electrodes for use in the methods described herein; Panel A shows a pair of planar electrodes in circuit with a power source; Panel B shows an array of three electrically-connected cylindrical electrodes paired with another array of three electrically-connected cylindrical electrodes, which are in circuit with a single power source; and Panel C shows an array of three pairs of cylindrical electrodes, wherein each pair is in circuit with a separate a power source.

There is considerable variation in the measured properties among samples of covetic materials that have been processed and tested at various laboratories using conventional covetic manufacturing methods. In a typical conventional processes, graphite electrodes are inserted into the molten metal and current is passed through these electrodes. The graphite electrode has electrical conductivity of about $7.4 \times 10^4$ Siemens-per-meter (S/m; or (0.074 MS/m), whereas the conductivities of molten aluminum and copper are about $3.92 \times 10^6$ S/m (3.92 MS/m) and $4.66 \times 10^6$ S/m (4.66 MS/m), respectively. The graphite electrode is more resistive compared to the molten aluminum and copper. We have discovered that, due to the large mismatch in the electrical conductivity between the electrodes and molten metal, a very high current density region is formed around the electrode where the electrode meets the molten metal. Current density gradually decreases within the molten metal as a function of the distance from the electrode/molten metal interface. As a result, only an extremely small region between the electrodes reaches uniform current density during covetic conversion process. This non-uniformity in the current distribution in the molten metal-carbon pool causes non-uniform, incomplete covetic conversion, which results in considerable variation in measured properties of the covetic samples produced thus far, from batch-to-batch, and within a single batch.

For example, electrical current density modeling using COMSOL MULTIPHYSICS modeling software shows that producing an aluminum covetic material with two cylindrical graphite electrodes, results in a very non-uniform current density distribution in the melt-pool. For example, when a 30 Amp current is passed between the electrodes, there is a region of very high current density at the interface where the less-conducting graphite electrodes (conductivity of about $7.4 \times 10^4$ S/m; or 0.074 MS/m) contact the more-conducting aluminum-carbon melt-pool surface (conductivity of about $3.92 \times 10^6$ S/m, or 3.92 MS/m). When the less-conducting graphite electrode touches the melt (whose conductivity is 50 times greater), electrons immediately flow away from the electrode along the surface of the melt, rather than through the submerged portion of the electrode. This results in an enhanced current density in the small region where the electrode meets the melt, i.e., at the surface of the melt-pool, but only limited current density beneath the surface of the melt-pool. The current spreads out from the surface as it moves away from the electrode, but the current density does not become uniform until some distance from the electrode.

Some of the regions of non-uniform current density are below the critical current density for covetic conversion. If the conductivities of the electrode and melt are more closely matched, however, then the current flows through the entire electrode rather than along the surface of the melt, and then the current flows uniformly into the melt. This results in uniform current density through almost the entire melt, and thus produces much more uniform covetic conversion.

For example, electrical current modeling shows that replacing the graphite electrodes with copper electrodes (conductivity of copper electrode at the aluminum covetic conversion temperature of about 750° C. is about 15 MS/m, i.e., about 4 times the conductivity of molten aluminum), results in a more uniform current density distribution. With the copper electrodes, the current flows through the entire electrode that is submerged below the melt surface and current flows uniformly into the melt, rather than immediately flowing away from the electrode along the surface of the melt, as is the case with the less conductive graphite electrodes. The high current density region in the immediate vicinity of the graphite electrodes is eliminated with the copper electrodes. Use of copper electrodes with a coating to prevent dissolution of the copper into the molten aluminum, or use of aluminum bronze, electrodes for aluminum covetic processing, produces uniform current density throughout substantially the entire melt. For example, the conductivity of molten aluminum is about 3.92 MS/m at a typical reaction temperature of 700° C., while the conductivity of certain aluminum bronze materials at the same temperature is about 4.6 MS/m. Molten aluminum does not react with aluminum bronze electrodes.

Electrode Geometry.

It is highly preferable that the geometries of opposing paired electrodes in circuit with the power source should be complementary (i.e., of similar shape, size, etc. or sized and shaped to reflect the contours of the opposed electrodes and/or the reaction vessel). One preferred geometry is that both electrodes are plates of substantially the same dimensions and surface area; see e.g., FIG. 1, Panel A or FIG. 4, Panel A. If curved electrodes, such as cylindrical (FIGS. 1-5), tubular (FIG. 3 and FIG. 4), ring-shaped (FIG. 5), or a curved trough-shaped plate electrodes (FIG. 2, Panel C) are used, it is preferable in some cases that the curved electrodes have the largest practical curvature (i.e., the radius of curvature of the electrodes should be as large as is practical for the reactor size and reactor internal geometry). The methods described herein aim for as uniform current density as possible within the entire volume of the molten metal pool to achieve complete covetic conversion (i.e., substantially all of the molten mixture is within a region of uniformly distributed current density). In some embodiments, planar electrodes are preferred over cylindrical electrodes. It is also acceptable to pair electrodes with complementary geometries, such as a central cylindrical electrode surrounded by an array of concave, curved, trough-shaped electrodes (e.g., as In FIG. 2, Panel C). Alternatively or in addition, multiple curved or planar electrodes can be used in various configurations designed to provide more uniform current distribution in the melt-pool (e.g., as in FIGS. 1 and 2). The geometric arrangement of electrodes of a given electrode conductivity can be modeled (e.g., with COMSOL MULTIPHYSICS modeling software; or another such modeling software) to aid in optimizing the current density distribution for a specified covetic target composition, if desired.

Electrode Arrangements.

If covetic conversion is performed in a batch furnace or a molten metal bath, using a fixed volume melt-pool, just two electrodes (positive and negative) having a shape or geometry (e.g., planar geometry; see e.g., FIG. 1, Panel A), or a series of electrode pairs, as discussed above, can be utilized. Alternatively, a single electrode can be placed in the middle of the melt pool and three or more electrodes of opposite polarity can be positioned evenly-spaced around the central electrode (see e.g., FIG. 2). In yet another alternative, one or more annular electrodes (e.g., a ring-shaped or tubular electrodes) can surround a central electrode (e.g., a cylindrical electrode) of opposite polarity; e.g., as in FIG. 3, FIG. 4, Panel B, or FIG. 5. In a continuous flow reactor, two or more pairs of opposed electrodes (e.g., one or more pairs of planar electrodes as in FIG. 4, Panel A; or a central cylindrical electrode surrounded by one or more tubular or ring-shaped electrodes as in FIG. 3, FIG. 4, Panel B, or FIG. 5) can be utilized in the flow path of the reactor so that the melt pool flows between the electrodes.

FIG. 1 illustrates arrangements of paired electrodes for use in the methods described herein. Panel A of FIG. 1 shows a planar electrode 100 paired with a planar electrode 102 of substantially the same size and shape, in circuit with a power source 104, disposed within a heated reactor vessel 150. Alternatively, reactor vessel 150 could be cylindrically-shaped or the corners thereof could be rounded. Panel B of FIG. 1 shows an array of three electrically-connected cylindrical electrodes 110, and an array of three electrically-connected cylindrical electrodes 112, which are in circuit with a single power source 114. Panel C of FIG. 1 shows an array of three pairs of cylindrical electrodes 120 and 122, in which each pair is connected in circuit with its own power source 124. Use of different power sources for each electrode pair can provide the ability to make adjustments to the current density on different regions of the melt-pool. In use, the reactor vessel would contain a molten mixture of a metal and carbon (preferably stirred by a mechanical agitator), which would cover or at least partially cover the electrodes while current is passed through the molten mixture via the electrodes to induce formation of a covetic nanocarbon-infused metal product (also referred to herein as a covetic metal-carbon composite material). The power sources can be AC or DC power sources. Of course, other numbers of connected electrodes can be used besides those shown in the Figure.

Figure 2:
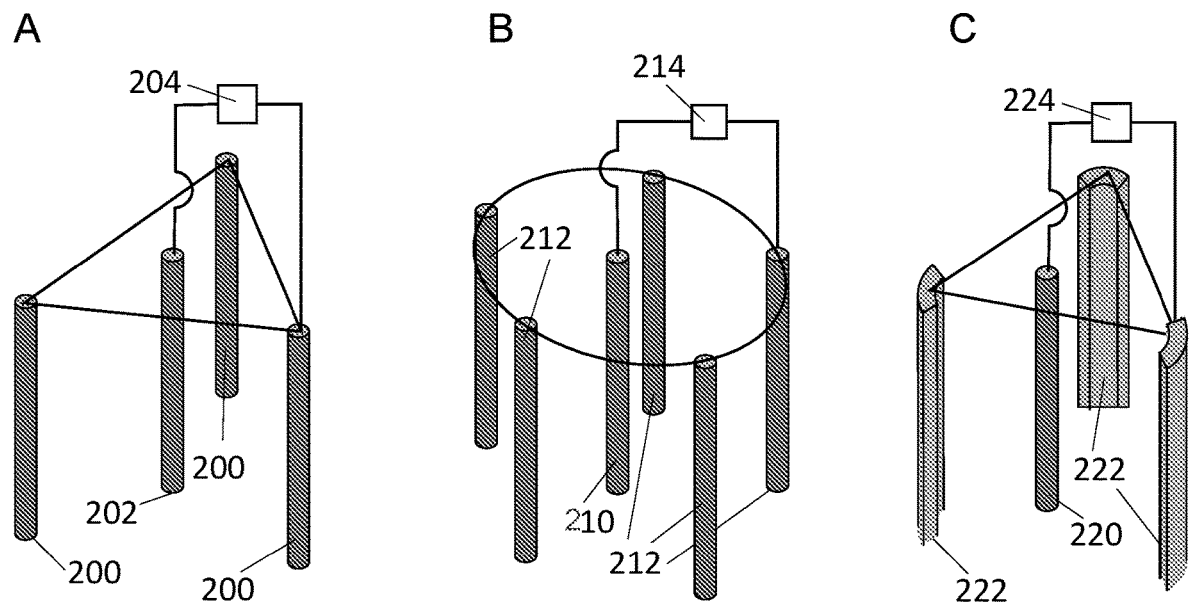
FIG. 2 illustrates alternate arrangements of electrodes for use in the methods described herein; Panel A shows an array of three electrically-connected cylindrical electrodes evenly spaced and positioned around a single cylindrical central electrode, which are in circuit with a power source; Panel B shows an array of five electrically-connected cylindrical electrodes evenly spaced and positioned around a single central cylindrical electrode, which are in circuit with a power source; and Panel C shows an array of three electrically-connected curved electrodes evenly spaced and positioned around a single central cylindrical electrode, which are in circuit with a power source.

FIG. 2 illustrates alternate arrangements of electrodes for use in the methods described herein. FIG. 2, Panel A shows an array of three electrically-connected cylindrical electrodes 200 evenly spaced and positioned around a single central cylindrical electrode 202, for use in the methods described herein (e.g., for use with a cylindrical reactor vessel, with the array of electrically-connected electrodes near the periphery of the interior of the reactor). The electrodes are connected in circuit with a power source 204 (either AC or DC). Panel B of FIG. 2 shows an array of five electrically-connected electrodes 212 evenly spaced and positioned around a single central cylindrical electrode 210. The electrodes are connected in circuit with a power source 214 (either AC or DC). FIG. 2, Panel C shows an array of three electrically-connected curved, trough-shaped electrodes 222 evenly spaced and positioned around a single central cylindrical electrode 220, which are connected in circuit with a power source 224 (either AC or DC). In use, the heated reactor vessel would contain a molten mixture of a metal and carbon (preferably stirred by a mechanical agitator), which would cover or at least partially cover the electrodes while current is passed through the molten mixture via the electrodes to induce formation of a covetic nanocarbon-infused metal product (also referred to herein as a covetic metal-carbon composite material). Of course, other numbers of connect electrodes can be used besides those shown in the Figure.

Figure 3:
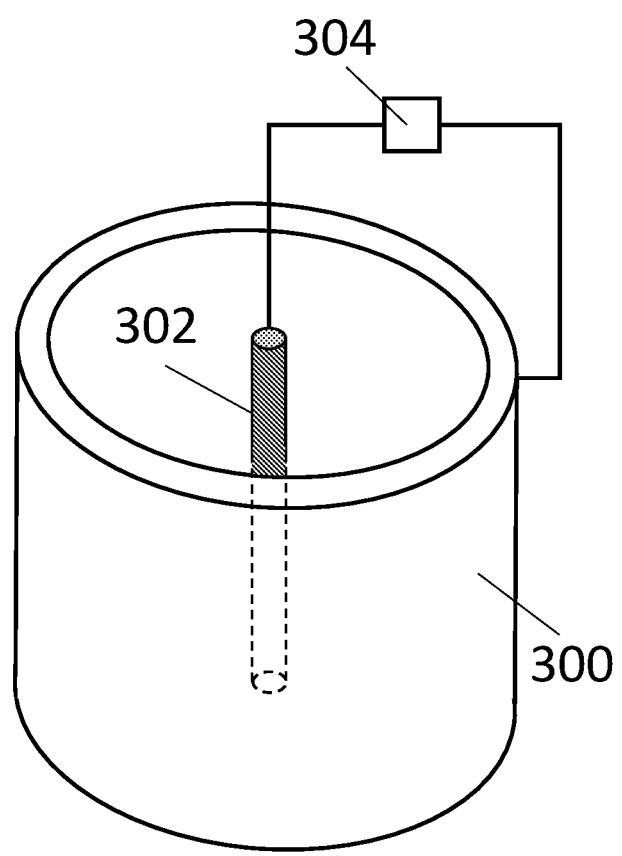
FIG. 3 illustrates a tubular electrode paired with and surrounding with a cylindrical electrode positioned at the longitudinal axis of the tubular electrode.

FIG. 3 illustrates a tubular electrode 300 paired with a cylindrical electrode 302 positioned at the longitudinal axis of tubular electrode, for use in the methods described herein (e.g., for use with a cylindrical reactor vessel, with the cylindrical electrode sized and positioned to be near the periphery of the interior of the reactor). Electrodes 300 and 302 are connected in circuit with a power source 304 (either AC or DC). In use, the reactor vessel would contain a molten mixture of a metal and carbon (preferably stirred by a mechanical agitator in a batch reactor, or flowing through the tubular electrode in a flow reactor), which would cover or at least partially cover the electrodes while current is passed through the molten mixture via the electrodes to induce formation of a covetic nanocarbon-infused metal product.

Figure 4:
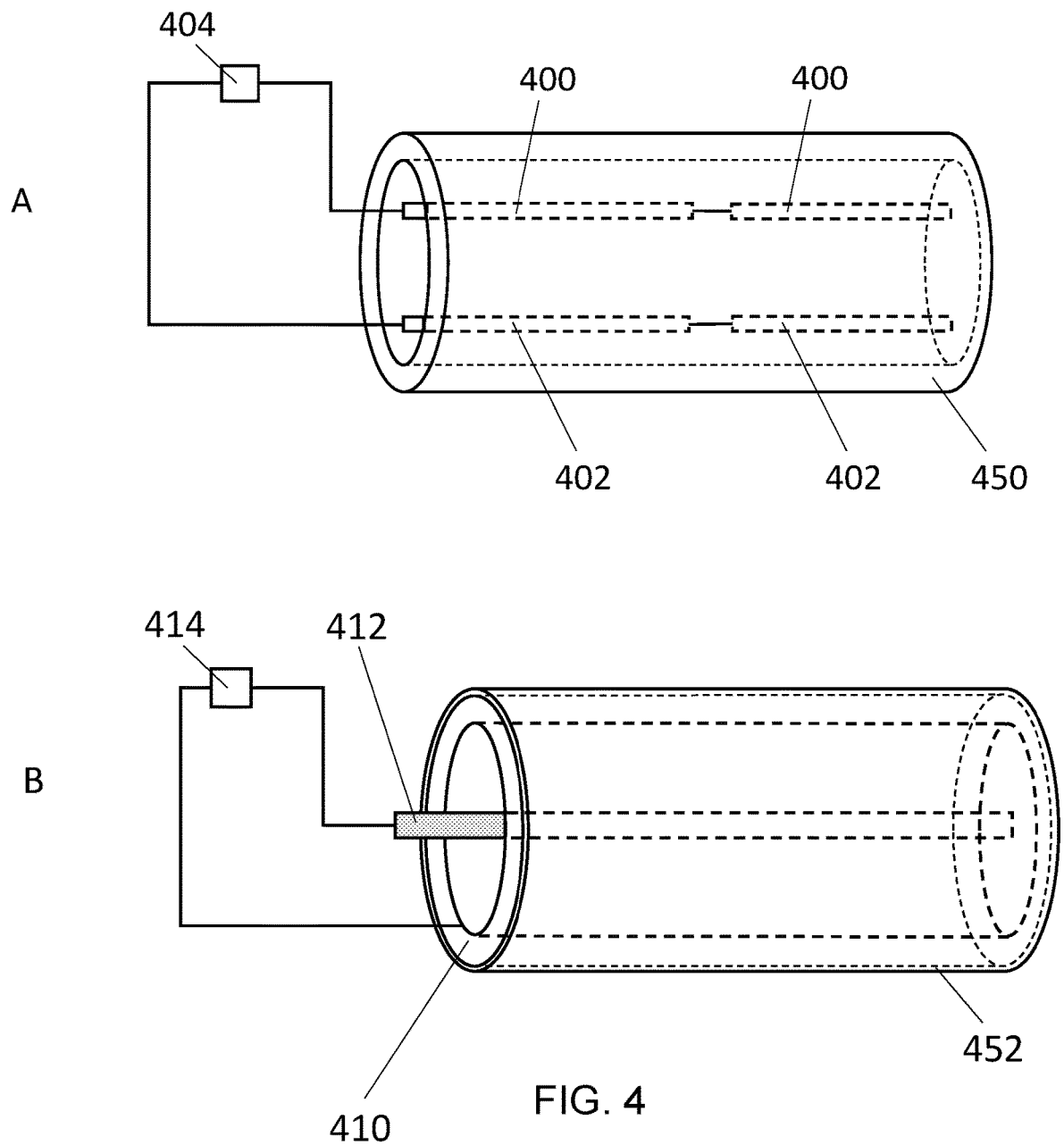
FIG. 4 illustrates arrangements of electrodes for use. e.g., in a tubular, continuous-flow reactor; Panel A shows spaced pairs of planar electrodes arranged linearly within a tubular reactor; and Panel B shows a tubular electrode lining the interior of a tubular reactor, paired with a cylindrical electrode positioned at the longitudinal axis of the tubular electrode.

FIG. 4 illustrates arrangements of electrodes for a tubular, continuous-flow reactor. Panel A shows spaced pairs of planar electrodes, each pair comprising electrode 400 paired with electrode 402, in which electrodes 400 are electrically connected to each other, and the electrodes 402 also are electrically connected to each other. The electrodes 400 and 402 are arranged longitudinally within a tubular reactor 450, and are in circuit with power source 404 (either AC or DC). Panel B of FIG. 4 shows a tubular electrode 410 lining the interior of a tubular reactor 452, paired with a cylindrical electrode 412 positioned along the longitudinal axis of the tubular electrode 410. Electrodes 410 and 412 are in circuit with a power source 414 (either AC or DC). In use, a molten mixture of a metal and carbon would flow through the reactor vessel between the electrodes, while current is passed through the molten mixture via the electrodes to induce formation of a covetic nanocarbon-infused metal product.

Figure 5:
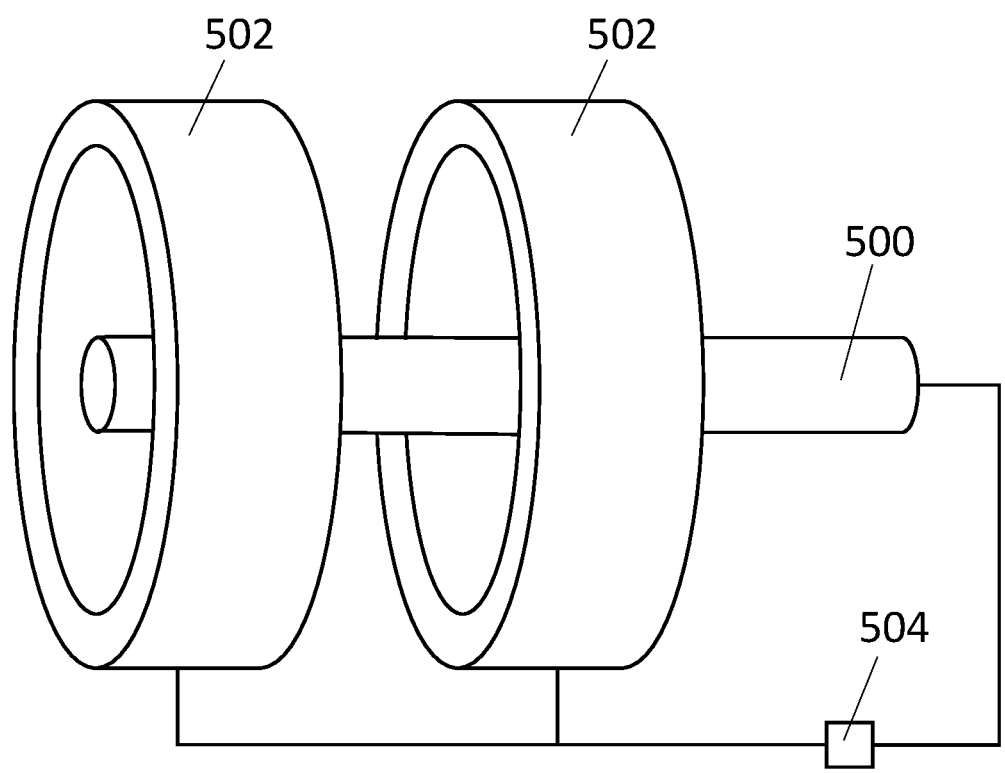
FIG. 5 illustrates an electrode arrangement in which a central cylindrical electrode is surrounded by multiple annular (ring-shaped) electrodes.

FIG. 5 illustrates an electrode arrangement in which a central cylindrical electrode 500 is surrounded by multiple annular (ring-shaped) electrodes 502 that are electrically connected to each other. The electrodes are in circuit with a power source 504 (either AC or DC). In use, a molten mixture of a metal and carbon would flow through the reactor vessel between the electrodes, while current is passed through the molten mixture via the electrodes to induce formation of a covetic nanocarbon-infused metal product.

Active Cooling of the Electrodes.

In cases where the melting points of the electrode material and metal that is being covetically converted are close enough that there is good chance that the electrode will melt during covetic processing, the electrodes can be actively cooled to prevent melting. For example, this can happen if a copper covetic in being produced using copper or copper alloy electrodes. In such cases, air or water or some other fluid can be circulated within the electrodes to keep the electrode at a temperature above its melting point. Water-cooled electrodes are used, for example, in resistance spot welding of automobile body parts during assembly. It is, of course, important point to prevent freezing of the melt-pool at or near the actively cooled electrode-molten metal interface, in order to avoid what metallurgists call dendrite formation (similar to ice sickle formation). Dendrite formation can be avoided using sufficient fluid motion (e.g., stirring or flow) to break any dendrites that may form. In addition, the electrode may be coated with material that is thermally insulating, but electrically conducting; or by an electrically-conductive material that inhibits wetting between electrode and molten metal, so long as the coating is thin enough not to significantly interfere with the electrical conduction of the electrodes.

Specific Examples of Electrode/Melt-Pool Combinations.

Two important factors in selecting suitable electrode materials for a given molten metal are (a) the relative conductivities of the electrodes and metal, and (b) the relative melting points of the electrodes and the metals. For example, if no active cooling is used, the melting point of the electrode materials should be significantly higher (e.g., at least about 300° C. higher) than the temperature of the melt-pool metal that is being processed. If the melt temperatures of the electrode and the melt-pool are very close, then some kind of active cooling of the electrodes is needed. In the case of electrical conductivity, the conductivity of the electrode should be at least about 50% (e.g., about 50, 55, 60, 65, 70, 75, 80, 85, 90, or 95%) of the electrical conductivity of the molten metal being processed at the reaction temperature. In some embodiments the electrical conductivity of the electrode is about equal to or exceeds the electrical conductivity of molten metal undergoing covetic conversion.

Additionally, reactions between the electrode and molten metal should be avoided (e.g., by selecting materials that do not tend to react with one another). Typically, an electrode candidate may be selected based on the first two points (i.e., acceptable melting point differences and acceptable electrical conductivity differences), taking into consideration potential reactivity between the electrode material and molten metal. If there is potential or known reactivity between the electrode material and metal being process, (e.g., for dissolution of some of the electrode material into the melt-pool, or some other reaction), steps will need to be taken to inhibit such reactions. For example, the electrode surface can be coated with a material that inhibits wetting between electrode and molten metal (e.g., coating the electrode with a thin layer of a ceramic, a refractory material, an intermetallic, and/or an alloy); or the fluid may be agitated or may be caused to flow with sufficient velocity so as to minimize contact time between a given portion of the melt-pool with the electrode surface.

Non-limiting examples of electrode material/molten metal combinations include:
(a) electrode materials for making copper covetics: (i) molybdenum (copper and molybdenum are insoluble in one another at all temperatures, and requires no coating or active cooling), (ii) Titanium diboride (there is no known reaction between $TiB_2$ and molten copper, and requires no coating or active cooling) (iii) copper or a copper alloy (e.g., Constantan, Cu—Ni alloy; or Manganin, a Cu—Mn alloy) with active cooling, (iv) tungsten coated with a sufficiently inert conductive material (e.g., a conductive ceramic, a conductive intermetallic, or a conductive metal/alloy), and (v) palladium coated with a sufficiently inert conductive material (e.g., a conductive ceramic, a conductive intermetallic, or a conductive metal/alloy);
(b) electrode materials for making aluminum covetics: (i) aluminum bronze (without a coating or active cooling), (ii) $TiB_2$ (without a coating or active cooling), (iii) copper, molybdenum, silver, gold, and platinum, all of which are coated with another sufficiently inert conductive material (e.g., a conductive ceramic, a conductive intermetallic, or a conductive metal/alloy); and (iv) an aluminum alloy with active cooling; and
(c) electrode materials for making iron covetics: tungsten, molybdenum, iridium, ruthenium, and $TiB_2$, all of which are coated with another sufficiently inert conductive material (e.g., a conductive ceramic, a conductive intermetallic, or conductive metal/alloy) to prevent reactivity with the iron.

As used herein, the term "aluminum bronze" refers to alloy composed of copper in which the main alloying metal added to the copper is aluminum, in contrast to standard bronze or brass. A variety of aluminum bronzes of differing compositions have found industrial use, with most ranging from 5% to 11% aluminum by weight, the remaining mass being primarily copper; other alloying agents such as iron, nickel, manganese, and silicon are also sometimes included in aluminum bronzes.

When coatings are used, the coating layers should be thin enough so as not to significantly interfere with the electrical conductivity of the electrode, as a whole, but thick enough to prevent the undesirable reactions with the melt-pool. The effects of a given coating material and dimensions thereof, can be modeled for a specific covetic composition using COMSOL MULTIPHYSICS modeling software, or another such modeling software, to aid in electrode design. The selection of a suitable material and thickness is within the level of ordinary skill in the metal arts.

Table 1 provides melting points and room temperature electrical conductivity information (including the temperature coefficient, determined at room temperature) for various materials that can be of use in choosing appropriate combinations of materials for potential use as components of the electrodes and melt-pools. Of course, the conductivities of the materials will be different at the reaction temperatures used in the methods described herein, as is well known in the art. In most cases, the conductivities at different temperatures are published in treatises, handbooks, journals, manufacturer literature, and the like. Additionally, the conductivities can be readily determined by routine methods known to those of ordinary skill in the art.

TABLE 1

| Material | Melting Point ° C. | Conductivity σ (S/m) at 20° C. | Temperature coefficient ($K^{-1}$) |
|---|---|---|---|
| Silver | 961 | $6.30 \times 10^7$ | 0.0038 |
| Copper | 1085 | $5.96 \times 10^7$ | 0.00404 |
| Annealed copper | 1085 | $5.8 \times 10^7$ | — |
| Gold | 1064 | $4.1 \times 10^7$ | 0.0034 |
| Aluminum | 660 | $3.77 \times 10^7$ | 0.0039 |
| Calcium | 838 | $2.98 \times 10^7$ | 0.0041 |
| Tungsten | 3410 | $1.79 \times 10^7$ | 0.0045 |
| Zinc | 419 | $1.69 \times 10^7$ | 0.0037 |
| Nickel | 1453 | $1.43 \times 10^7$ | 0.006 |
| Iron | 1536 | $1 \times 10^7$ | 0.005 |
| Platinum | 1772 | $9.43 \times 10^6$ | 0.00392 |
| Tin | 505 | $9.17 \times 10^6$ | 0.0045 |
| Gallium | 302 | $7.1 \times 10^6$ | 0.004 |
| Niobium | 7242 | $7 \times 10^6$ | — |
| Carbon steel (1010) | 3825 | $6.99 \times 10^6$ | — |
| Lead | 600 | $4.55 \times 10^6$ | 0.0039 |
| Titanium | 1935 | $2.38 \times 10^6$ | 0.0038 |
| Manganin | 960 | $2.07 \times 10^6$ | 0.000002 |
| Constantan | 1210 | $2.04 \times 10^6$ | 0.000008 |
| Stainless steel | 1400-1450 | $1.45 \times 10^6$ | 0.00094 |
| Manganese | 1518 | $6.94 \times 10^5$ | — |
| Nichrome | 1400 | $6.7 \times 10^7$ | 0.0004 |
| Beryllium | 1277 | $2.5 \times 10^7$ | — |
| Molybdenum | 2610 | $1.9 \times 10^7$ | — |
| Cobalt | 1495 | $1.6 \times 10^7$ | — |
| Rhodium | 1966 | $2 \times 10^7$ | — |
| Silicon | 1414 | $1.6 \times 10^{-3}$ | — |

TABLE 1-continued

| Material | Melting Point °C. | Conductivity σ (S/m) at 20° C. | Temperature coefficient (K⁻¹) |
|---|---|---|---|
| Aluminum bronzes | e.g., 600-1000 | **varies | — |
| Titanium diboride | 3225 | $1 \times 10^7$ | — |

**As is well known in the art, electrical conductivity varies with composition in cases where the material is an alloy; e.g., the electrical conductivity of aluminum bronze depends on the specific composition of the aluminum bronze alloy. For example, the electrical conductivity of an aluminum bronze alloy containing 81% copper, 4% iron, 4.5% nickel (including Co), 9% aluminum and 1% manganese is about 7% of the International Annealed Copper Standard (IACS) at 20° C. (or $4.2 \times 10^6$ S/m) The electrical conductivity of an aluminum bronze alloy containing 83.2% copper, 4% iron and 10.8% aluminum is about 13% IACS at 20° C. (or $7.8 \times 10^6$ S/m).

The enhanced properties of covetic metals likely result from carbon nanostructures and networks that form between the metal matrix and carbon nanoparticles. Two distinct carbon nanostructures have been found in covetic materials: (1) carbon clusters with size ranging from a few nanometers (nm) to several hundred nm, and (2) graphene-like carbon nanostructures that become incorporated within the metal matrix. The uniformity of the distribution of carbon in the metal matrix also can affect the properties. The methods described herein are designed to improve the uniformity of the covetic structure by providing a substantially more uniform current distribution through the melt-pool than conventional methods that utilize highly mismatched electrical conductivities between the electrodes and the melt pool.

Optionally, the methods described herein can be utilized in combination with the processes described in co-pending and co-owned U.S. Patent Application Publication No. 2018/0073110 and U.S. Ser. No. 16/009,897, both of which are incorporated herein by reference in their entireties, e.g., by replacing the graphite electrodes used in those applications with an electrode selected to have a suitable conductivity, melting point and reactivity as described herein.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The terms "consisting of" and "consists of" are to be construed as closed terms, which limit any compositions or methods to the specified components or steps, respectively, that are listed in a given claim or portion of the specification. In addition, and because of its open nature, the term "comprising" broadly encompasses compositions and methods that "consist essentially of" or "consist of" specified components or steps, in addition to compositions and methods that include other components or steps beyond those listed in the given claim or portion of the specification. Recitation of ranges of values herein are merely intended to serve as a shorthand method of referring individually to each separate value falling within the range, unless otherwise indicated herein, and each separate value is incorporated into the specification as if it were individually recited herein. All numerical values obtained by measurement (e.g., weight, concentration, physical dimensions, removal rates, flow rates, and the like) are not to be construed as absolutely precise numbers, and should be considered to encompass values within the known limits of the measurement techniques commonly used in the art, regardless of whether or not the term "about" is explicitly stated. All methods described herein can be performed in any suitable order unless otherwise indicated herein or otherwise clearly contradicted by context. The use of any and all examples, or exemplary language (e.g., "such as") provided herein, is intended merely to better illuminate certain aspects of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The embodiments of the invention in which an exclusive property or privilege is claimed are defined as follows:

1. A process for preparing a covetic nanocarbon-infused metal material comprising the steps of:
    (a) heating a stirring molten mixture of a metal and carbon at a temperature sufficient to maintain the mixture in the molten state in a reactor vessel;
    (b) passing an electric current through the stirring molten mixture via at least two spaced electrodes that are immersed or at least partially immersed in the molten mixture; and
    (c) recovering the resulting covetic material from the reactor;
    wherein the electrodes are in circuit with an electrical power source that supplies the electric current, each electrode has an electrical conductivity that is at least about 50 percent of an electrical conductivity of the molten mixture at the temperature of the molten mixture; the at least two spaced electrodes comprise a tubular electrode surrounding a longitudinally oriented cylindrical central electrode; and wherein the electrodes are coated with a substance that provides an inert barrier to reaction of the electrodes with the molten mixture and-the substance that provides an inert barrier comprises at least one material selected from the group consisting of a conductive ceramic material, a conductive metal, a conductive intermetallic, and a conductive alloy.

2. The process of claim 1, wherein the metal of the molten mixture comprises at least one metal selected from the group consisting of Cu, Al, Ag, Au, Fe, Ni, Pt, Sn, Pb, Zn, and Si.

3. The process of claim 1, wherein the metal of the molten mixture comprises copper; and the electrodes are constructed from one or more metals selected from the group consisting of tungsten and palladium.

4. The process of claim 1, wherein the metal of the molten mixture comprises aluminum; and the electrodes are constructed from one or more metals selected from the group consisting of (i) aluminum bronze, (ii) titanium diboride, and (iii) copper, molybdenum, silver, gold, platinum, or a combination of two or more thereof.

5. The process of claim 1, wherein the metal of the molten mixture comprises iron; and the electrodes are constructed from one or more metals selected from the group consisting of tungsten, molybdenum, iridium, ruthenium, and titanium diboride.

6. The process of claim 1, wherein the carbon is a particulate carbon material.

7. The process of claim 1, wherein the carbon comprises graphite.

8. The process of claim 1, wherein the process is conducted under an inert atmosphere having a partial pressure of oxygen of not more than about 0.1 Torr.

9. The process of claim 1, wherein the process is conducted under an inert atmosphere having a partial pressure of oxygen in a range of about 0.001 Torr to about 0.1 Torr.

10. The process of claim 1, wherein the molten mixture is heated at a temperature of at least about 50° C. above the melting point of the metal of the molten mixture.

11. The process of claim 1, wherein the total amount of carbon in the molten mixture comprises about 0.1 to about 10 percent by weight of the molten mixture.

12. The process of claim 1, wherein the total amount of carbon introduced into the metal comprises about 0.3 to about 4 percent by weight of the molten mixture.

13. The process of claim 1, wherein the conductivity of each electrode is greater than or equal to the conductivity of the molten mixture.

* * * * *